(12) United States Patent
Gyotoku et al.

(10) Patent No.: US 6,573,703 B1
(45) Date of Patent: Jun. 3, 2003

(54) SEMICONDUCTOR DEVICE

(75) Inventors: Taichi Gyotoku, Kyotanabe (JP); Toru Kakiage, Neyagawa (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/543,364

(22) Filed: Apr. 5, 2000

(30) Foreign Application Priority Data

Apr. 5, 1999 (JP) .............................. 11-097309

(51) Int. Cl.[7] ................................. G01R 31/28
(52) U.S. Cl. ................................... 324/158.1; 714/726
(58) Field of Search ..................... 324/158.1, 765, 324/760; 714/726, 721, 733, 734, 763, 724, 719, 720; 371/22.3

(56) References Cited

U.S. PATENT DOCUMENTS

| | | | | | |
|---|---|---|---|---|---|
| 5,043,988 | A | * | 8/1991 | Brglez et al. ................. | 371/27 |
| 5,282,224 | A | * | 1/1994 | Harada ..................... | 324/76.11 |
| 5,323,400 | A | * | 6/1994 | Agarwal et al. ............ | 371/22.3 |
| 5,329,532 | A | * | 7/1994 | Ikeda et al. ................ | 324/73.1 |
| 5,341,096 | A | * | 8/1994 | Yamamura .................. | 324/765 |
| 5,477,493 | A | * | 12/1995 | Danbayashi ................ | 365/201 |
| 5,509,019 | A | * | 4/1996 | Yamamura ................. | 371/21.1 |
| 5,519,714 | A | * | 5/1996 | Nakamura et al. ......... | 324/73.1 |
| 5,703,884 | A | * | 12/1997 | Ozaki ........................ | 371/22.3 |
| 6,020,752 | A | * | 2/2000 | Shimasaki .................. | 324/765 |
| 6,060,897 | A | * | 5/2000 | Shacham et al. ........... | 324/765 |
| 6,212,656 | B1 | * | 4/2001 | Fosco et al. ................ | 714/726 |
| 6,327,683 | B1 | * | 12/2001 | Maccormack ............... | 714/726 |

FOREIGN PATENT DOCUMENTS

| | | |
|---|---|---|
| JP | 7-84009 | 3/1995 |
| JP | 9-055411 | 2/1997 |
| JP | 11-352194 | 12/1999 |
| WO | WO 01/38889 A1 * 5/2001 | ........... G01R/31/28 |

* cited by examiner

Primary Examiner—Kamand Cuneo
Assistant Examiner—Jimmy Nguyen
(74) Attorney, Agent, or Firm—Parkhurst & Wendel, L.L.P.

(57) ABSTRACT

A semiconductor for having a reduced required number of probes for inputting burn-in data to a target circuit, including two separate scan chains having respective first and second input terminals, and a selector for selecting one of first data from a first input terminal and second data from a second input terminal and supplying the selected first and second data to the second scan chain.

6 Claims, 14 Drawing Sheets

Prior Art

SEMICONDUCTOR DEVICE

BACKGROUND OF THE INVENTION (1) Field of the Invention

The present invention relates to a semiconductor device, and more particularly, to a semiconductor device in which a circuit to be burned-in is stressed with the use of a scan chain.

(2) Description of the Prior Art

FIG. 1 shows a block diagram of a prior-art semiconductor device. In FIG. 1, the reference numeral 1 denotes an entire system of the semiconductor device. The reference numeral 31 denotes a first input terminal. The reference numeral 311 denotes an input signal (input signal line) from the first input terminal. (Hereinafter, "signal lines" are also referred to as "signal".) The reference numeral 32 denotes a second input terminal. The reference numeral 321 denotes an input signal from the second input terminal. The reference numeral 41 denotes a first output terminal for normal testing, which excludes burn-in testing for eliminating initial failures, and the reference numeral 42 a second output terminal for the normal testing. The reference numeral 2 denotes a subject circuit to be burned-in. The reference numeral 201 denotes a first output signal from the subject circuit 2, and the reference numeral 202 denotes a second output signal from the subject circuit 2.

Now, a scan chain in the semiconductor device 1 is explained. A scan chain refers to a circuit (chain) in which plural flip-flops are connected so that an output of a flip-flop is connected to an input of another flip-flop and such connection is repeated to form a chain. The subject circuit 2 in FIG. 1 includes two scan chains 21 and 22 each configured in such a manner, and corresponding combinational circuits.

In FIG. 1, each of the squares 80 denotes a flip-flop, and the circuit 2 is tested with the use of the scan chain 21 provided between the first input terminal 31 and the first output terminal 41 and of the scan chain 22 provided between the second input terminal 32 and the second output terminal 42.

Next, scan testing using the scan chains is detailed. In scan testing (hereinafter referred to as "scan shift"), since the flip-flops are connected in cascade from the scan input terminal to the scan output terminal, a data can be set at a certain flip-flop by feeding a signal from the scan input terminal. When data are set in the flip-flops, normal operation is performed to operate the combinational circuits and scan shift is again performed to compare signals from the scan output terminal. Testing of the circuits is thus implemented.

When burn-in testing is performed, it is made possible, by repeating a scan shift and a normal operation with the use of scan chains, to operate a subject circuit to a greater degree and thereby to stress the subject circuit with a greater stress. Thus, when implementing burn-in testing using such scan chains, test signals are input from both the first input terminal 31 and the second input terminal 32 in order to stress the subject circuit 2.

The above-described prior-art semiconductor device, however, has a following drawback. In the prior-art semiconductor device, when the number of scan chains is increased, the number of input terminals is correspondingly increased. However, wafer level burn-in has a limitation in the number of probes. That is, in wafer level burn-in, all the LSIs on a single wafer must be subjected to burn-in, but the number of probes that can be provided for a single wafer is limited. Therefore, as the chip size is reduced, the number of probes that can be provided for each of the LSIs is also reduced. For this reason, if the number of scan chains is excessively increased, wafer level burn-in becomes difficult to implement, and in worst cases, it becomes impossible.

Nevertheless, with recent advances in technology and demands from users which have become increasingly diversified and complicated, chip size of LSIs has been made further smaller.

Accordingly, there is a need for a simple and low-cost semiconductor device that does not require a large number of input terminals necessary for burn-in testing.

In addition, with increasingly diversified demands in reliability of semiconductor devices, there is also a need for a semiconductor device that enables various burn-in tests, for example by inputting arbitrary patterns.

SUMMARY OF THE INVENTION

The present invention is accomplished in order to provide a solution to the foregoing and other problems in prior art, by providing a semiconductor device in which a data for burn-in testing from an input terminal of one scan chain can be fed to another scan chain.

The invention also provides a semiconductor device in which a data for burn-in testing that is output from one scan chain can be fed to another scan chain.

These semiconductor devices according to the invention make it possible to eliminate the foregoing limitation of the number of probes.

The invention also provides a semiconductor device in which a data for burn-in testing which is fed from each input terminal of a plurality of scan chains, or a data for burn-in testing which is output from a plurality of scan chains can be fed to other scan chains.

This configuration makes it possible to employ various patterns of data in burn-in testing.

The invention also provides a semiconductor device in which a data for burn-in testing which is fed from each input terminal of a plurality of scan chains, or a data for burn-in testing which is output from a plurality of scan chains can be fed to other plural scan chains.

This configuration also makes it possible to employ various patterns of data in burn-in testing.

A semiconductor device according to the invention in which a data for burn-in testing that is output from one scan chain can be fed to another scan chain may further comprise a delay circuit for delaying the data for burn-in testing which is output from one scan chain.

This configuration also makes it possible to employ various patterns of data in burn-in testing.

In a scan chain to which a data for burn-in testing is not supplied from a corresponding input terminal, a selector may be provided between the corresponding input terminal and the scan chain such that the data for burn-in supplied from an input terminal of another scan chain. The selector passes one of input signals to a downstream scan chain in response to an external selecting signal.

In the case where a plurality of such selectors are provided, a control circuit having an element capable of storing a state such as a flip-flop, a latch, ROM, RAM or the like may be provided to instruct each of the selectors to select an input signal. The control circuit controls selecting operation of each of the selectors in response to a selecting signal or the like which is synchronized with a clock signal.

Further, a semiconductor device according to the invention may be configured so that the selectors are connected in cascade. According to such a configuration, it is made possible to eliminate a problem of fan out, and to implement such a test that burn-in is performed in certain circuit blocks and not in other circuit blocks.

In addition, a semiconductor device according to the invention allows circuit design to be readily modified for an optimal wafer level burn-in testing.

As described above, according to the present invention, in burn-in testing with the use of scan chains, the number of input terminals used for inputting burn-in data to subject circuits can be reduced. Thereby, reduction in the number of probes for feeding burn-in data is achieved.

The invention also achieves burn-in testing in which complicated input is supplied.

In addition, since an element capable of storing a state such as flip-flop or the like is employed in the control circuit for controlling the selector, the control circuit is made simple.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Now, the present invention is detailed based on preferred embodiments thereof

EMBODIMENT 1

In this embodiment, a selector is provided between an input terminal and a scan chain. The selector is so provided that a signal from an input terminal of another scan chain can be supplied to the selector. Having such a configuration, the selector selects an input to the selector in response to an external selecting signal, so that a signal for burn-in testing from the input terminal from another scan chain is simultaneously input to the scan chains.

Figure 1:
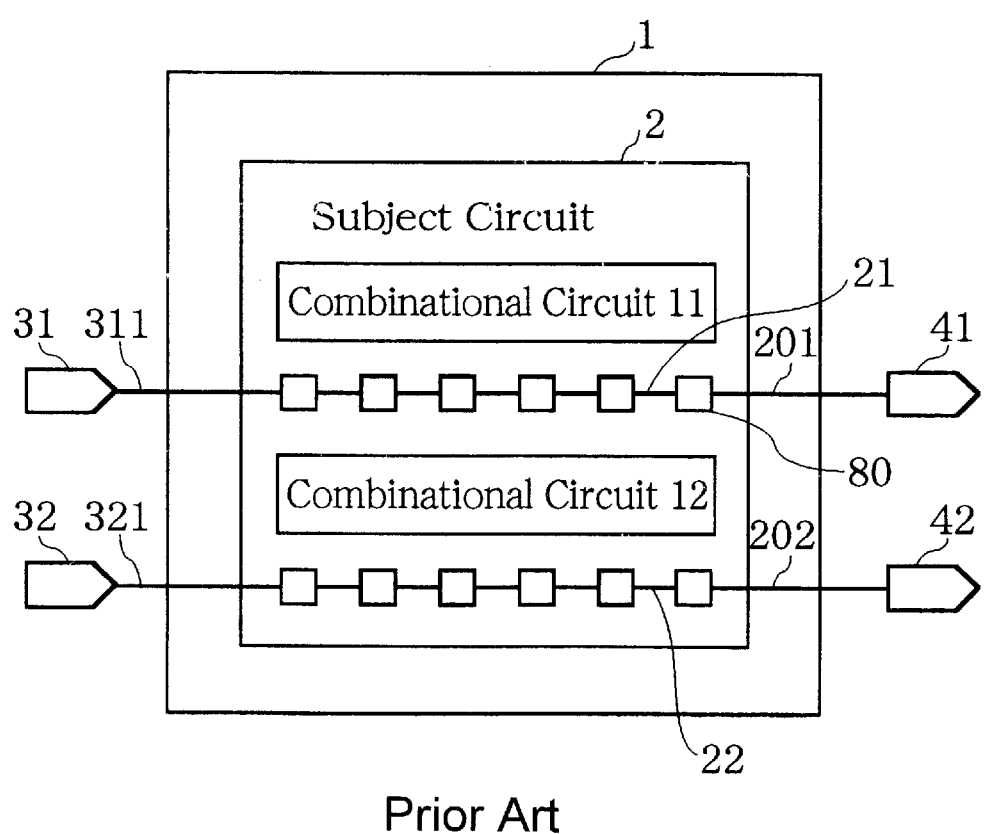
FIG. 1 is a diagram showing a prior-art semiconductor device.
Figure 2:
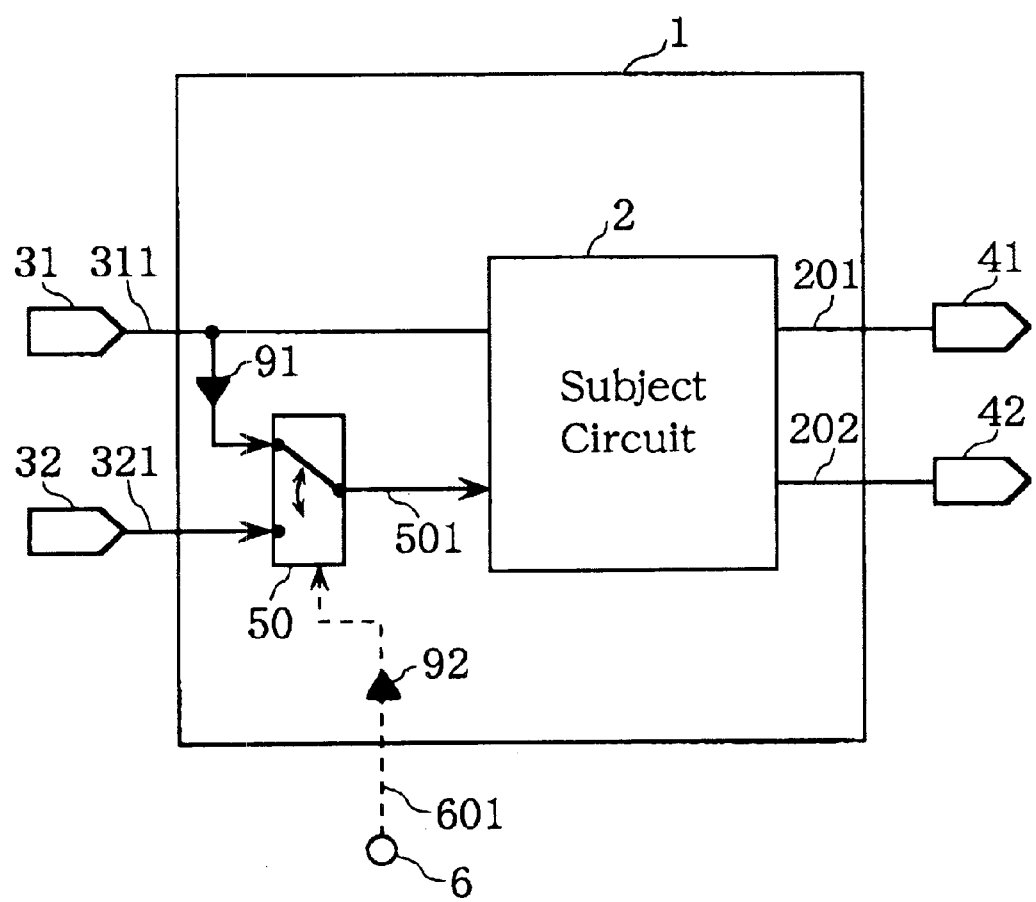
FIG. 2 is a diagram showing a semiconductor device according to Embodiment 1 of the present invention.

FIG. 2 shows a configuration of a semiconductor device according to Embodiment 1. It is noted here that in FIGS. 1 and 2, like reference numerals refer to like parts, and their respective descriptions are not repeated here. In addition, for the sake of brevity and clarity in figures, scan chains in the subject circuit 2 are not shown in the drawings. It is also noted that like reference numerals designate like parts throughout the accompanying drawings.

The semiconductor device 1 of FIG. 2 mainly differs from the foregoing prior-art device in that the device 1 of FIG. 2 comprises 1) a selector 50 provided between a second input terminal 32 to which a burn-in data is not supplied and a second scan chain which corresponds to the second input terminal 32, 2) a selecting signal input terminal 6 provided for feeding a selecting signal 601 to the selector 50, and 3) an amplifying circuit 91. The amplifying circuit 91 can be eliminated if the driving performance of the input signal is sufficient.

In the device 1 with such a configuration, a signal 311 from the first input terminal 31 is branched and supplied to the selector 50, and an input signal 321 from a second input terminal 32 is also supplied to the selector 50. An output signal 501 from the selector 50 is fed to the subject circuit 2. Note that in the accompanying drawings, selecting signals and control signals are designated by dashed lines.

Referring to FIG. 2, testing of the semiconductor device 1 is now detailed below.

First, in order to apply a stress to the subject circuit 2 using the scan chains, an input signal 311 is supplied from the input terminal 31. Secondly, a selecting signal 601 is supplied from the selecting signal input terminal 6 so that the selector 50 selects the signal 311 from the first input terminal 31. As a result, the subject circuit 2 receives the input signal 311 via the selector 50. Thereby, only the signal from the first input terminal 31 is necessary to stress the subject circuit 2 using the scan chains and thereby implement burn-in testing.

In the case of normal testing except burn-in testing, the selector 50 selects an input signal 321 from the second input terminal 32 in response to the selecting signal 601 from the selecting signal input terminal 6. The input signal 321 from the second input terminal 32 is thus supplied to the second scan chain in the subject circuit 2, which corresponds to the second input terminal 32. Specifically, in normal testing except burn-in, the input signal 311 from the first input terminal 31 and the input signal 321 from the second input terminal 32 are respectively input to the first and second scan chains in the subject circuit, and the first output signal 201 and the second output signal 202 are respectively output from the first output terminal 41 and the second output terminal 42.

As will be understood from the description above, in a semiconductor device in accordance with this embodiment, only one input terminal is needed to stress a plurality of circuits to be burned-in. Therefore, in performing wafer level burn-in, a limitation of the number of probes is eliminated.

EMBODIMENT 2

This embodiment is a variation of the foregoing Embodiment 1, in which plural selectors are provided in parallel.

Figure 3A:
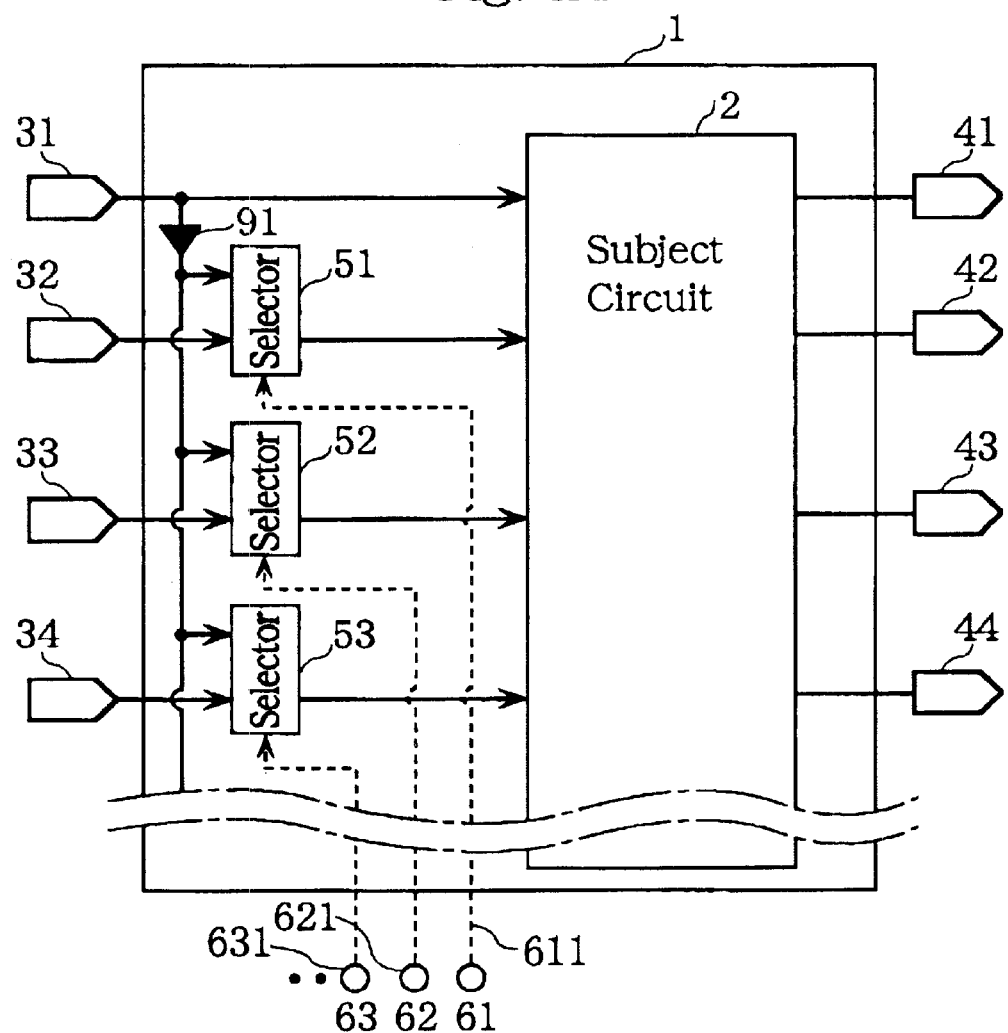
FIGS. 3A and 3B illustrate a semiconductor device according to Embodiment 2 of the present invention.
Figure 3B:
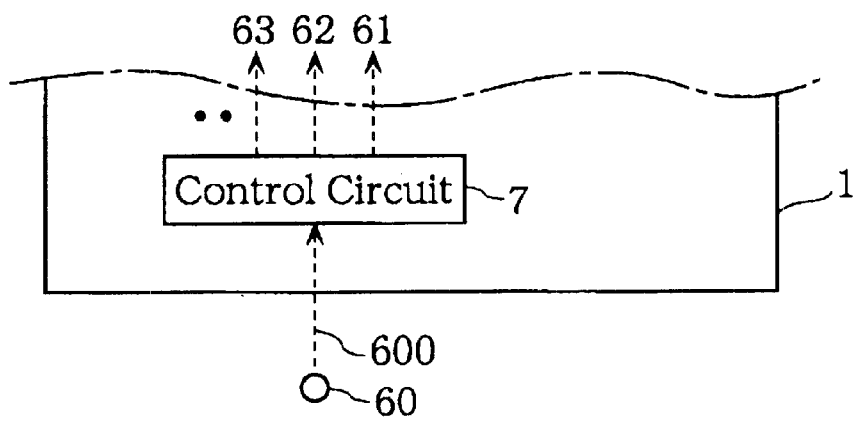

FIGS. 3A and 3B show configurations of a semiconductor device according to this embodiment. As shown in FIG. 3A, a plurality of scan chains are connected to the subject circuit 2 to be burned-in in the semiconductor device 1. In FIG. 3A, the reference numerals 33 and 34 denote a third and fourth input terminals respectively, and the reference numerals 43 and 44 a third and fourth output terminals respectively. The reference numeral 51 denotes a first selector, the reference numeral 52 a second selector, the reference numeral 53 a third selector. Each of the reference numerals 61, 62, and 63 denotes a selecting signal input terminal of the respective selectors, and each of the reference numerals 611, 621, and 631 denotes a selecting signal fed from each respective selecting signal input terminal to each of the selectors. The reference numeral 91 denotes an amplifying circuit for intensifying a driving performance of an input signal. In the device 1 of FIG. 3A, each of the selectors 51, 52, and 53 independently selects either one of two input signals in response to the respective selecting signals from each of the corresponding terminals 61, 62, and 63. By employing such a circuit configuration, such testing that burn-in is performed in certain circuit blocks and not in other circuit blocks is made possible. In addition, if the number of probes permits, a probe can be connected to an input terminal other than the first input terminal 31 so that more complicated signals can be fed to the subject circuits.

In normal testing, signals for the test is supplied from each of the first to fourth input terminals 31, 32, 33, and 34 and the signals are respectively output from each of the output terminals 41, 42, 43, and 44, in a similar manner to the foregoing Embodiment 1.

FIG. 3B shows a variation of the semiconductor device 1 of FIG. 3A, in which a control circuit 7 is provided so that each of the selectors 51, 52, and 53 can independently select the input data by using only one control signal input terminal 60. By feeding a predetermined control signal 600 from a control signal input terminal 60, the control circuit 7 controls the selectors 51, 52 and 53 so that the selectors 51, 52 and 53 independently select the input data. The rest of the configuration of the device 1 is identical to that of FIG. 3A. Note that FIG. 3B shows only the characterized portion of the device 1 in comparison with the device 1 of FIG. 3A.

The detail of the control circuit 7 will be given later.

EMBODIMENT 3

Figure 4A:
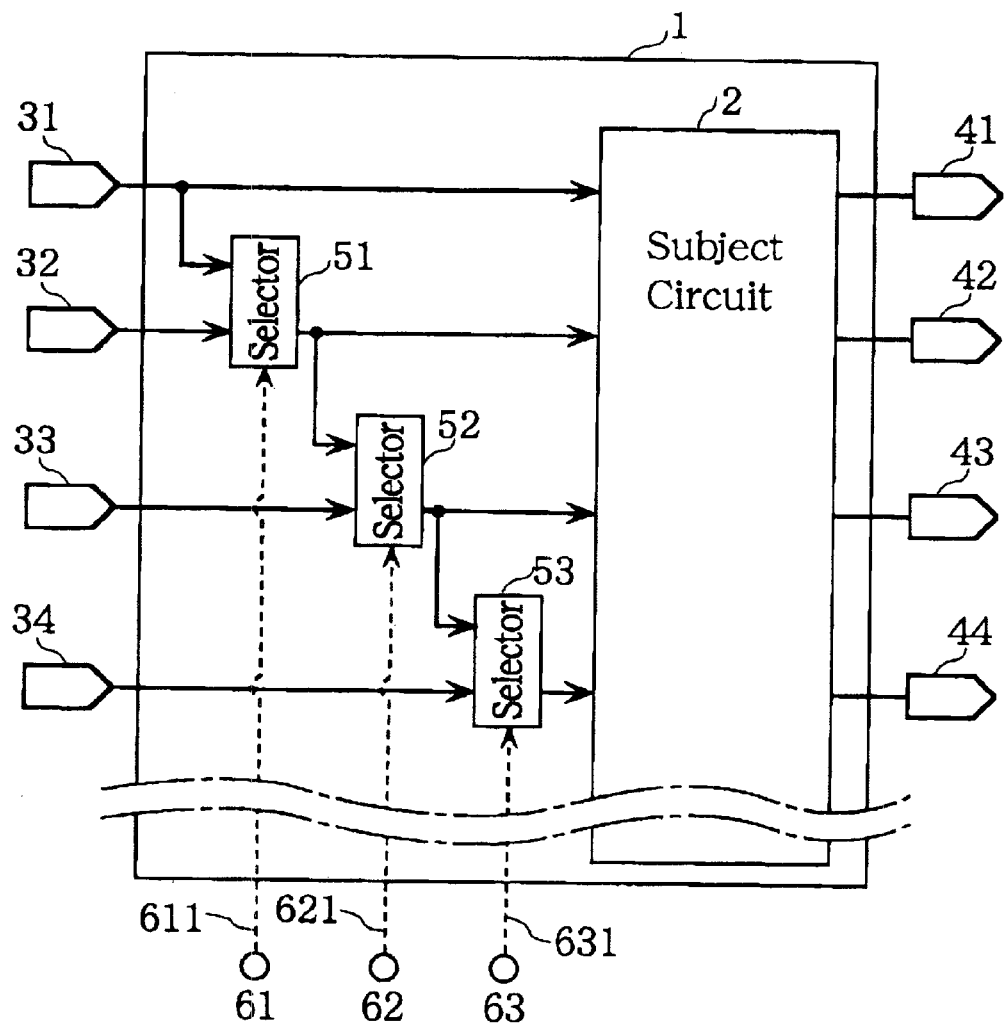
FIGS. 4A and 4B illustrate a semiconductor device according to Embodiment 3 of the present invention.

This embodiment is a variation of the foregoing Embodiment 2, in which a plurality of the selectors are connected in cascade as shown in FIG. 4A.

Figure 4B:
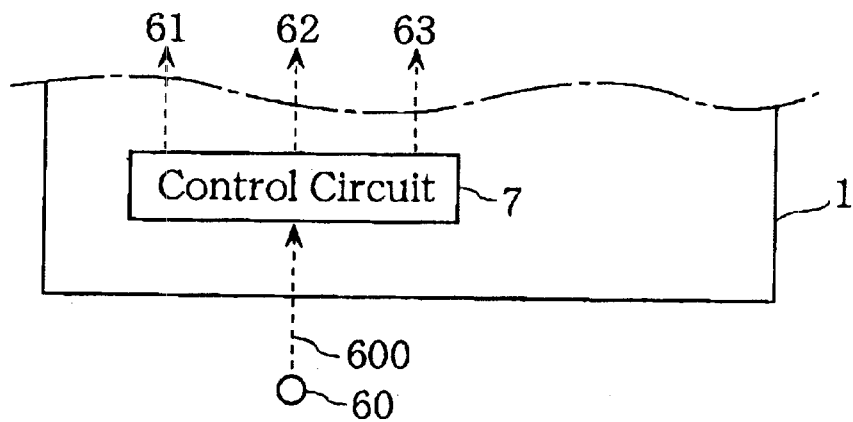

FIGS. 4A and 4B show configurations according to this embodiment. In a semiconductor device as shown in FIGS. 4A and 4B, it is made possible that a burn-in data from a single input terminal can be simultaneously supplied to a plurality of scan chains, as well as in a semiconductor device according to Embodiment 2.

FIGS. 4A and 4B respectively correspond to FIGS. 3A and 3B. FIG. 4A illustrates a semiconductor device 1 in which selecting signal input terminals 61, 62, and 63 are respectively provided for selectors 51, 52, and 53, and FIG. 4B illustrates a semiconductor device 1 having a control signal input terminal 60 and a control circuit 7.

According to this embodiment, since the selectors are connected in cascade as shown in FIG. 4A, it becomes unnecessary to consider a fan out (driving performance) of an input signal to be supplied to many scan chains.

EMBODIMENT 4

In this embodiment, an output data from one scan chain is supplied to another scan chain as an input data thereto.

A semiconductor device according to this embodiment has, in the upstream of the second scan chain, a selector 50 for selecting which one of an output data from a second input terminal and an output data from the first scan chain is to be supplied to the second scan chain.

Figure 5:
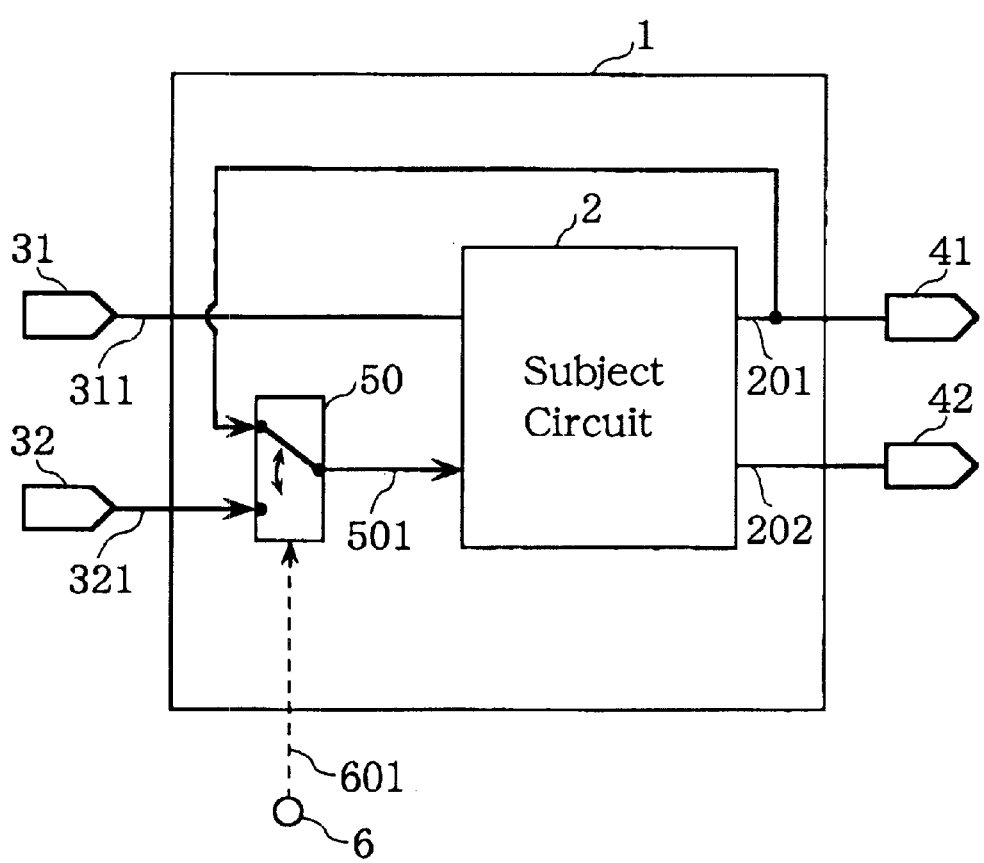
FIG. 5 is a diagram showing a semiconductor device according to Embodiment 4 of the present invention.

FIG. 5 shows a configuration of a semiconductor device according to this embodiment. Referring to FIG. 5, the semiconductor device 1 of FIG. 5 differs from a semiconductor device according to Embodiment 1 in that the selector 50 receives a first output signal 201 from the subject circuit 2 and an input signal 321 from the second input terminal 32. As in Embodiment 1, the selecting signal 601 is supplied from the selecting signal input terminal 6 in order for the selector 50 to select either of the input signals.

Now, testing in the semiconductor device 1 according to Embodiment 4 is detailed below.

First, an input signal 311 is fed from the first input terminal 31 to stress the subject circuit 2 to be burned-in with using scan chains. Also, the selecting signal 601 is supplied from the selecting signal input terminal 6 so that the first output signal 201 from the circuit 2 is selected as an input. As a result, the output signal 501 from the selector 50 is supplied to the second scan chain in the subject circuit 2.

Accordingly, the signals to be input to the circuit 2 are the input signal 311 from the first input terminal 31 and the output signal 501 simultaneously output from the selector 50. Consequently, the input signal from the first input terminal 31 can be supplied simultaneously to two scan chains in the subject circuit 2, and the subject circuit 2 can thus be stressed to implement burn-in.

In the case of normal testing except burn-in, the selector 50 selects the input signal 321 from the second input terminal 32 in response to the selecting signal 601 from the selecting signal input terminal 6. Accordingly, in normal testing, the first output signal 201 from the circuit 2 is output from the first output terminal 41 and the second output signal 202 is output from the second output terminal 42.

As will be understood from the foregoing discussion, in a semiconductor device according to this embodiment, it is possible to stress a subject circuit by using only one scan input terminal in burn-in testing. Moreover, since the first output signal from the subject circuit to be burned-in is used as an input signal to the second scan chain via a selector, it becomes unnecessary to consider the fan out.

In addition, in wafer level burn-in, the limitation of the number of probes is eliminated since only one input terminal is required for applying stress.

EMBODIMENT 5

This embodiment is a variation of the foregoing Embodiment 4. In this embodiment, plural selectors are provided in parallel, as in the foregoing Embodiment 2 which is a variation of Embodiment 1.

Figure 6A:
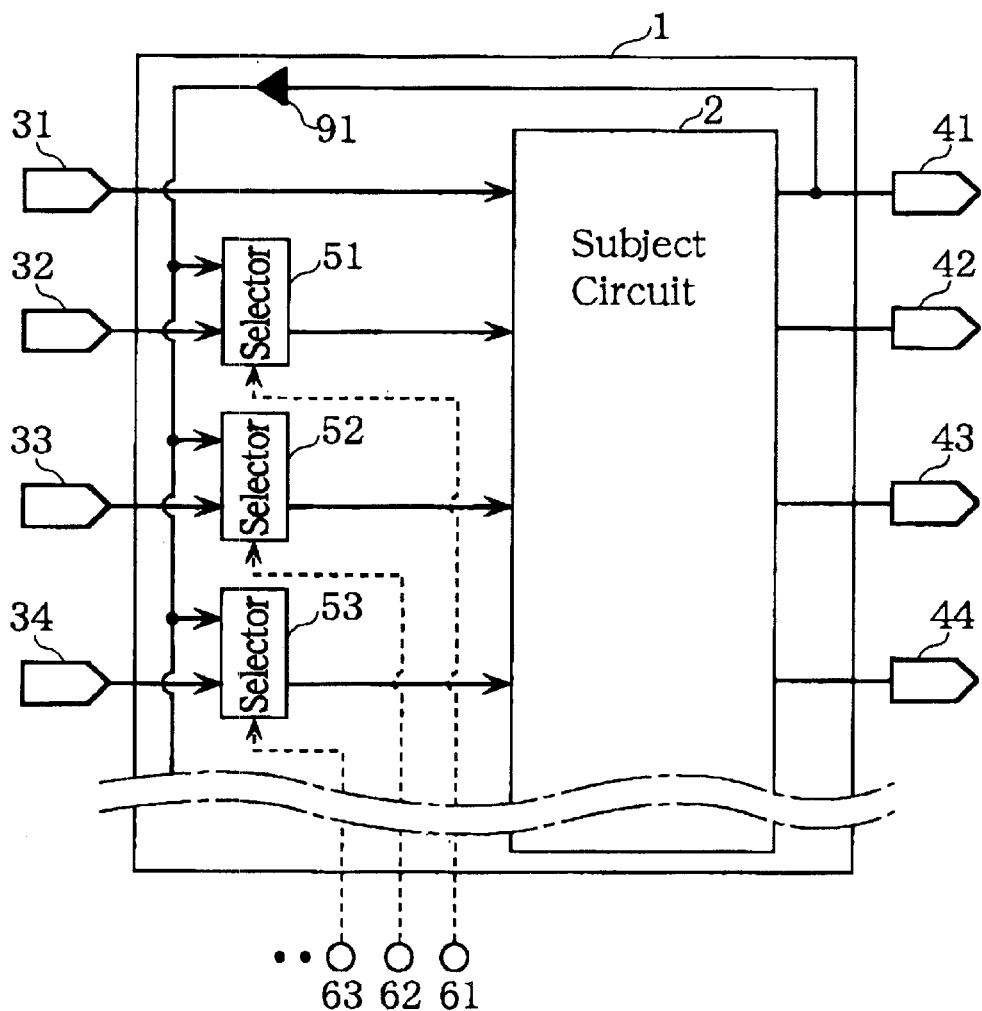
FIGS. 6A and 6B illustrate a semiconductor device according to Embodiment 5 of the present invention.
Figure 6B:
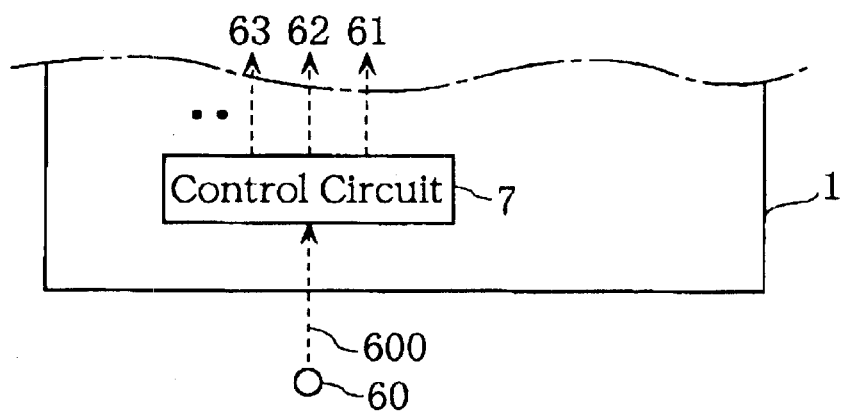

FIGS. 6A and 6B show configurations of semiconductor devices according to this embodiment. FIG. 6A corresponds to FIG. 3A in Embodiment 2, and FIG. 6B corresponds to FIG. 3B in Embodiment 2.

The advantageous effects of the semiconductor device according to this embodiment will be apparent from the foregoing discussions regarding Embodiments 1, 2, and 4 and therefore not be repeated here for the sake of brevity.

EMBODIMENT 6

This embodiment is a variation of the foregoing Embodiment 4. In this embodiment, plural selectors are provided in a similar manner to that of Embodiment 3, which is a variation of Embodiment 1.

Figure 7A:
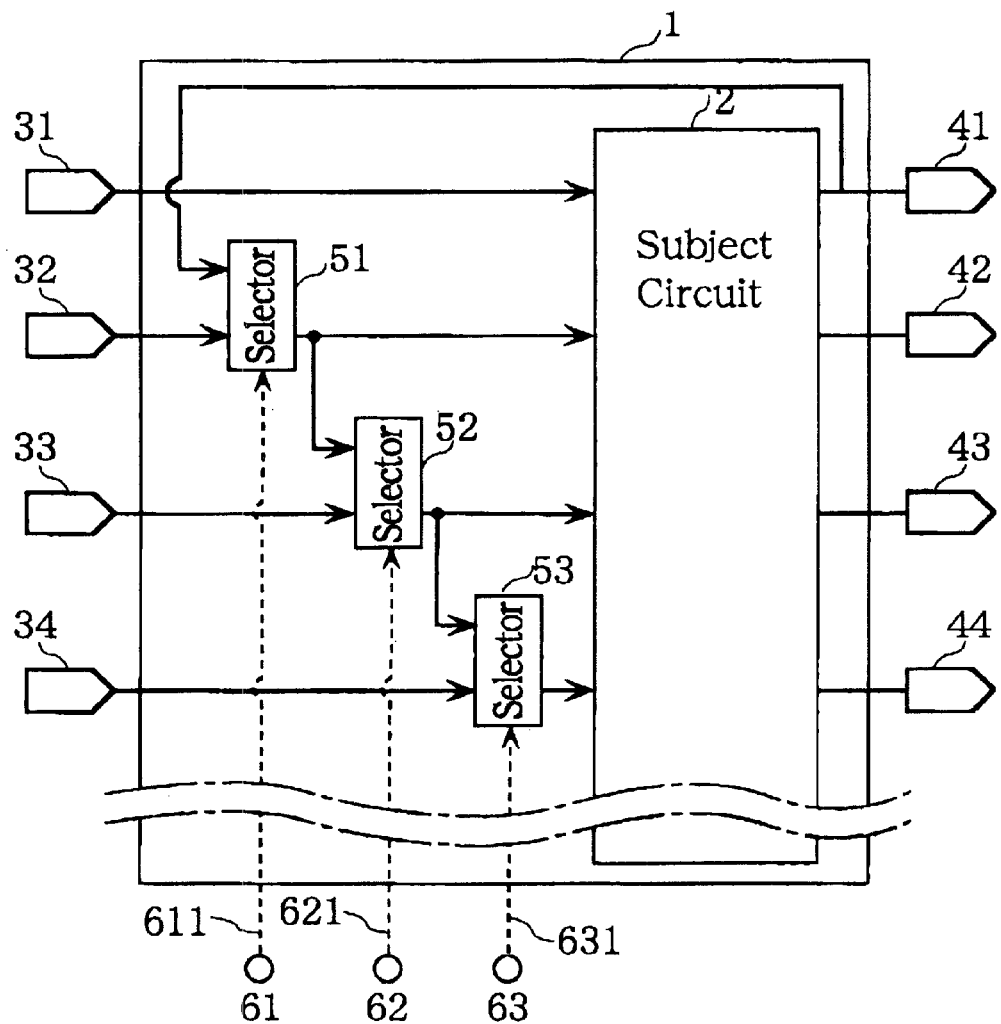
FIGS. 7A and 7B illustrate a semiconductor device according to Embodiment 6 of the present invention.
Figure 7B:
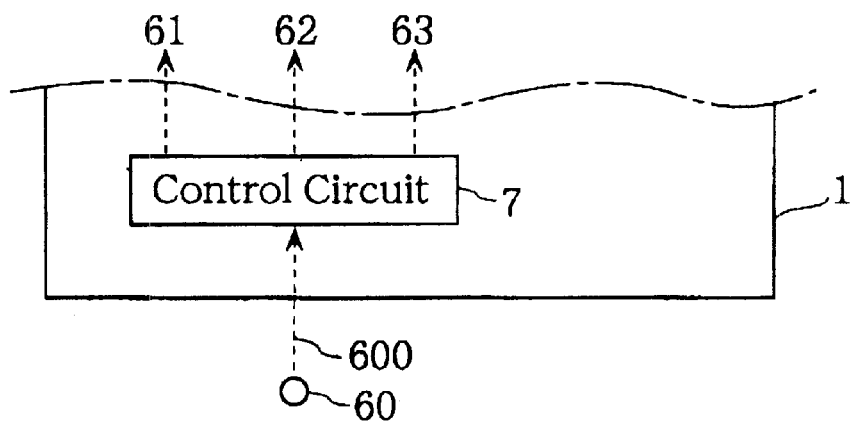

FIGS. 7A and 7B show configurations of semiconductor devices according to this embodiment. FIG. 7A corresponds to FIG. 4A in Embodiment 3, and FIG. 7B corresponds to FIG. 4B in Embodiment 3.

The advantageous effects of the semiconductor device according to this embodiment will be apparent from the foregoing discussions regarding Embodiments 1, 3, and 4, and therefore the discussions are not repeated here for the sake of brevity.

EMBODIMENT 7

This embodiment is a variation of the foregoing Embodiment 4, and a delay circuit for delaying an output data from a scan chain for 1 clock cycle or more is provided on a signal line for supplying the output data from the scan chain to another scan chain.

Figure 8A:
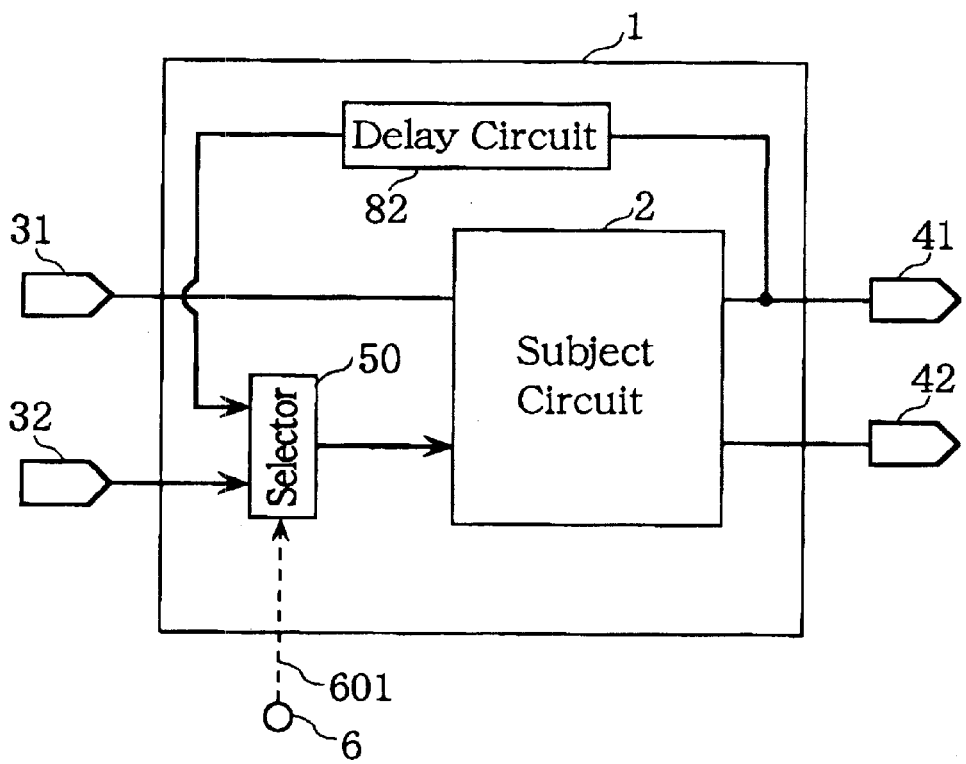
FIGS. 8A and 8B show semiconductor devices according to Embodiment 7 of the present invention.
Figure 8B:
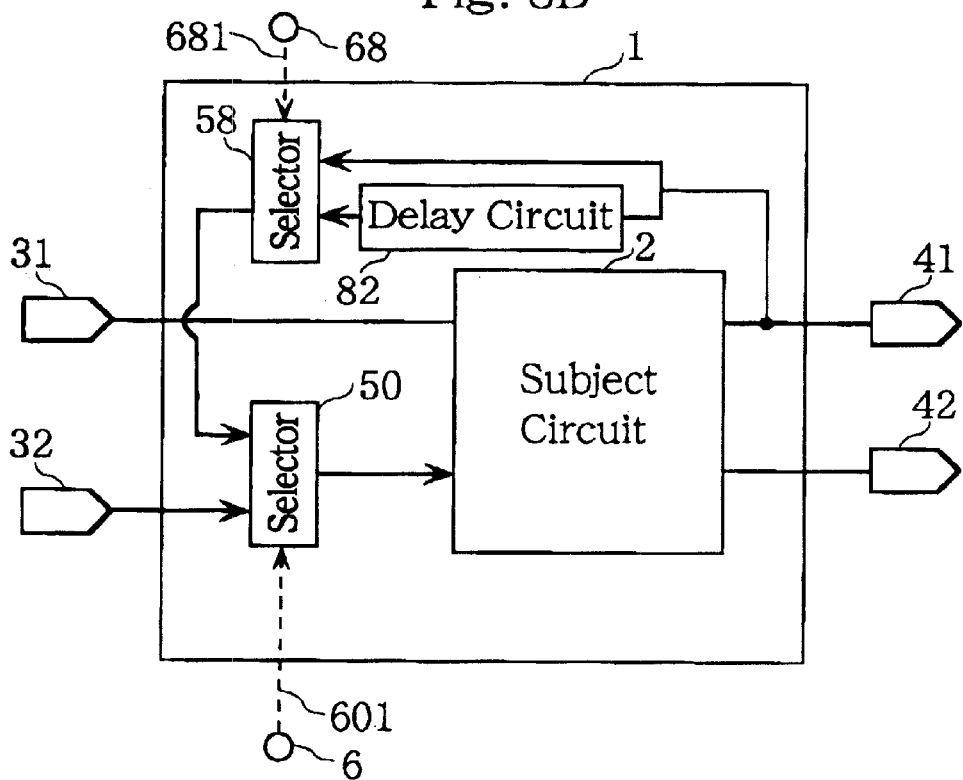

FIGS. 8A and 8B each show a semiconductor device according to this embodiment. In a semiconductor device 1 of FIG. 8A, a delay circuit 82 is provided in a signal line from which an output data signal from the first scan chain in the semiconductor device 1 of Embodiment 4, shown in FIG. 5, is branched and supplied to the selector 50, so as to delay the output data signal for 1 clock cycle or more. Thereby, burn-in test data with a delay time of 1 clock cycle or more can be supplied to the second scan chain, and consequently various burn-in tests can be implemented.

In a semiconductor device 1 of FIG. 8B, a selector 58 is provided in the downstream of the delay circuit 82, which is in the upstream of the second scan chain. Accordingly, by receiving a selecting signal 681 from an selecting signal input terminal 68 provided externally, the selector 58 can determine whether or not the output signal from the first scan chain is delayed.

It is noted here that in the case of a multiplicity of scan chains being present, a multiplicity of selectors may be provided in parallel or in such a manner as shown in FIGS. 3A or 4A. Further, an amplifying circuit may be provided according to the needs. Still further, in such configurations, a control circuit may also be provided.

It is also noted that such configuration may be employed that the amplifying circuit shown in FIGS. 3A and 6A is bypassed by using selectors as shown in FIG. 8B.

EMBODIMENT 8

This embodiment is a combination of a semiconductor device of FIG. 6B and a semiconductor device of FIG. 8B. This configuration achieves selection of a circuit block which is to be burned-in and a circuit block which is not to be burned-in.

Figure 9:
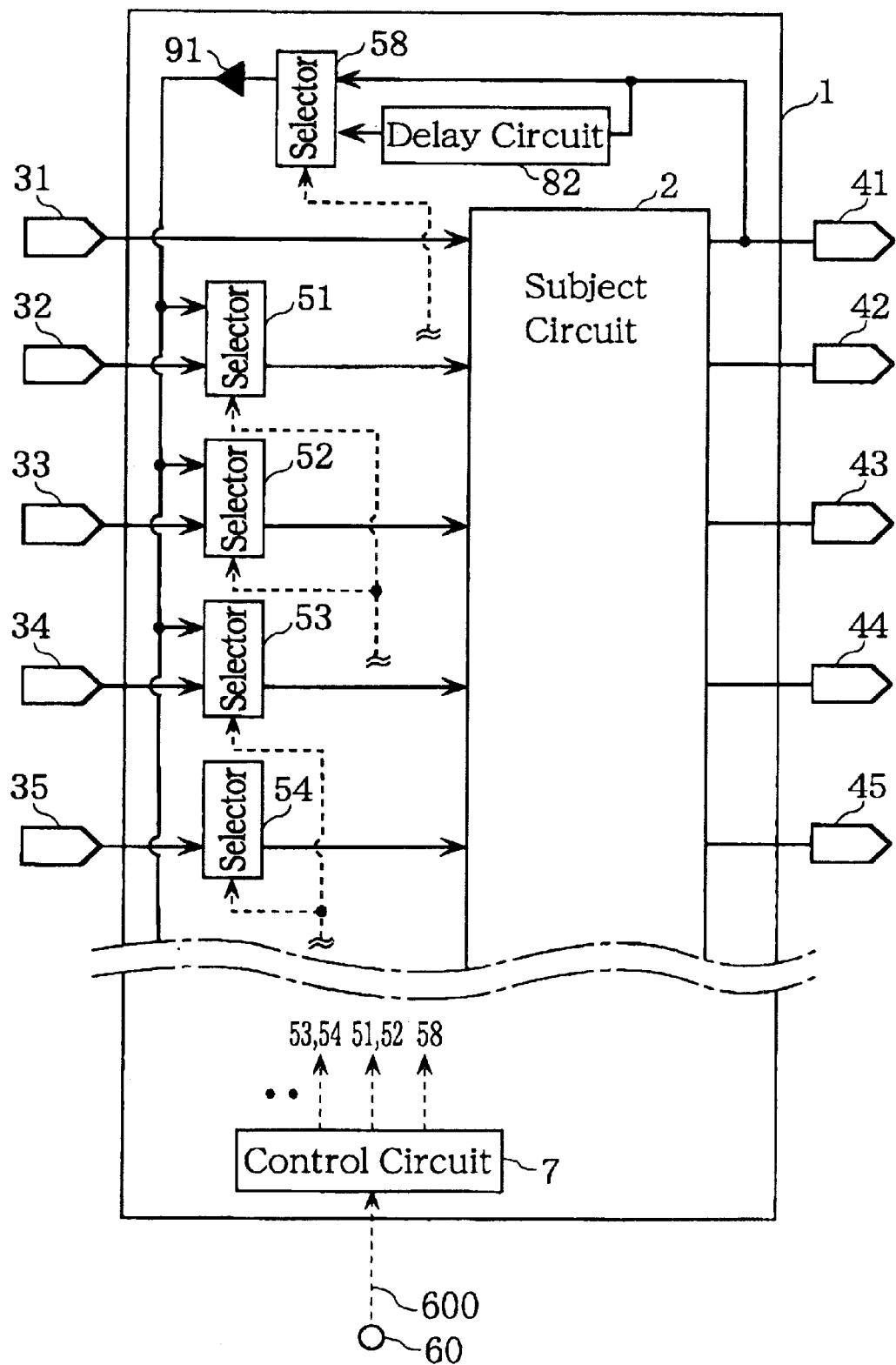
FIG. 9 is a diagram showing a semiconductor device according to Embodiment 8 of the present invention.

FIG. 9 shows a semiconductor device according to this embodiment. As shown in FIG. 9, when an output from the first scan chain is supplied to other scan chains, whether or not the output is delayed can be controlled by an input from the control circuit 7. In addition, selecting operation of the selectors is controlled by control signals from the control circuit 7 so that each two selectors make a pair to perform the selecting operation.

In this embodiment, although the selectors connected to the respective scan chains are connected in parallel, such a connection in cascade as shown in FIG. 4A may be employed.

In addition, a delay time of the output from the first scan chain may be varied, for example, by providing another buffer and selecting one of a buffer delaying a signal for 1 clock cycle and another buffer delaying a signal for 2 clock cycles.

EMBODIMENT 9

This embodiment is another variation of the foregoing Embodiment 1. A semiconductor device according to Embodiment 9 has two burn-in data input terminals each to which burn-in data is supplied, and accordingly has two selectors. A control circuit 7 is also provided.

Figure 10:
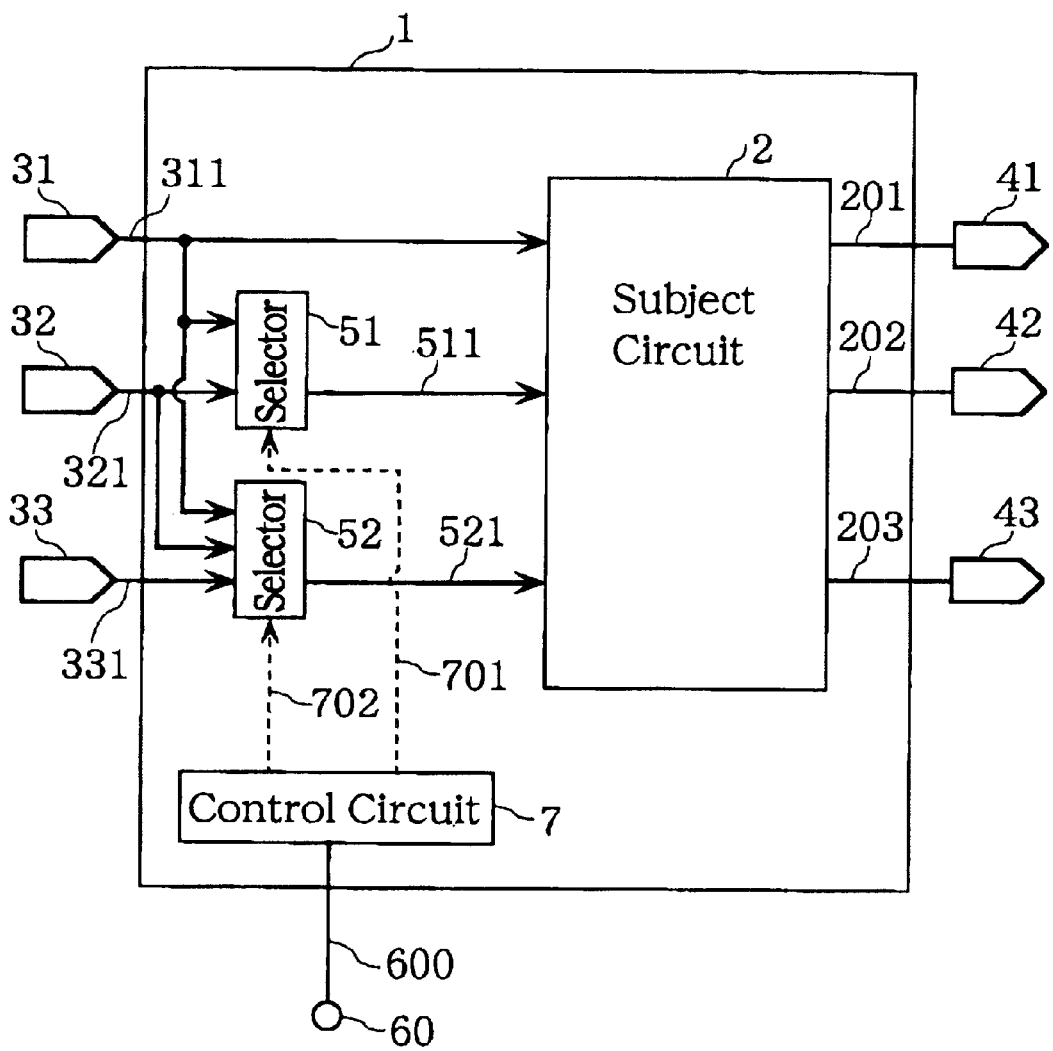
FIG. 10 is a diagram showing a semiconductor device according to Embodiment 9 of the present invention.

FIG. 10 shows a configuration of a semiconductor device according to this embodiment. In FIG. 10, the reference numeral 52 denotes a second selector to which input signals 311, 321 and 331 are supplied from a first input terminal 31, a second input terminal 32, and a third input terminal 33 respectively. The reference numeral 7 denotes a control circuit, 701 denotes a first selecting signal supplied from the control circuit 7 to the first selector 51, and 702 denotes a second selecting signal supplied from the control circuit 7 to the second selector 52.

The control circuit 7 receives a control signal 600 from a control signal input terminal 60, and thereby controls the selecting operation of these selectors 51 and 52.

The first selector 51 selects one of the input signals from the first input terminal 31 and the second input terminal 32 in a similar manner to that in the foregoing Embodiment 1.

Now, testing in this semiconductor device 1 is detailed below.

First, a signal for burn-in is supplied from the first input terminal 31 to stress the subject circuit 2 to be burned-in with using scan chains. Second, a predetermined signal is supplied from the control signal input terminal 60 to the control circuit 7, so that both the first and second selectors 51 and 52 select an input signal 311 from the first input terminal 31 in response to the first selecting signal 701 supplied to the first selector 51 and the second selecting signal 702 supplied to the second selector 52. Accordingly, the selectors 51 and 52 respectively output a selector output signal 511 and a selector output signal 521 to the subject circuit 2.

Consequently, when implementing burn-in, only the input signal from the input terminal 31 is needed to stress the subject circuit 2 to be burned-in.

In addition, it is also possible to stress the subject circuit 2 by the input signals from the first input terminal 31 and from the second input terminal 32, by the second selector 52 selecting an input signal 321 from the second input terminal 32 in response to the second selecting signal 702 from the control circuit 7.

In normal testing except burn-in testing, a control signal 600 from the control signal input terminal 60 controls the control circuit 7, so that the first selector 51 selects the input signal 321 from the second input terminal 32, and the second selector 52 selects an input signal 331 from a third input terminal 33. Then, the output signals 511 and 521 from the selectors 51 and 52 are supplied to the subject circuit 2 so as to perform normal testing except burn-in.

Thus, the input signals from the first, second, and third input terminals 31, 32, and 33 are supplied to the subject circuit 2 and respectively output from a first, second, and third output terminals 41, 42, and 43 as a first, second, and third output signals 201, 202, and 203.

As will be understood from the description above, in a semiconductor device in accordance with this embodiment, only one input terminal is needed to stress a plurality of subject circuits to be burned-in. Therefore, in performing wafer level burn-in, a limitation of the number of probes is eliminated.

In addition, since it is possible to use a plurality of scan input terminals if the number of probes permits, more complex patterns can be employed in burn-in testing. Moreover, since the selecting operation of the selectors is controlled by using flip-flops and the like, a limitation of control signal lines is eliminated.

EMBODIMENT 10

This embodiment is a variation relating to the second selector and the control circuit in the foregoing Embodiment 9.

Figure 11A:
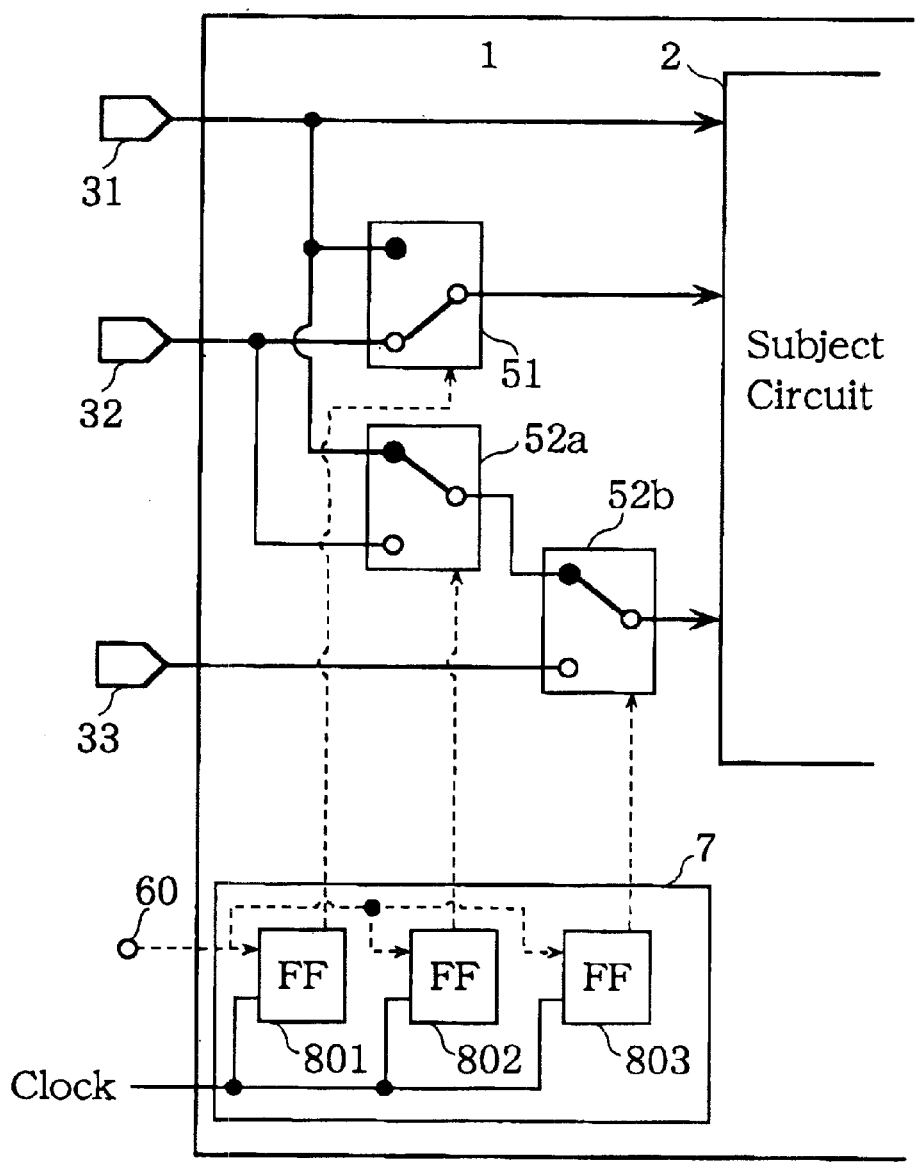
FIGS. 11A and 11B illustrate a semiconductor device according to Embodiment 10 of the present invention.
Figure 11B:
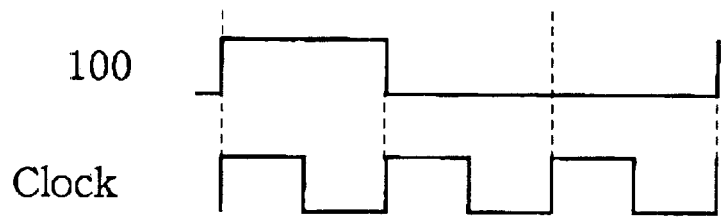

A configuration of this embodiment is shown in FIGS. 11A and 11B. As shown in FIG. 11A, the second selector 52 in Embodiment 9 comprises selectors 52a and 52b. The control circuit 7 comprises flip-flops 801, 802 and 803. In each selector, a dot at each selecting terminal denotes 0, and a circle at each selecting terminal denotes 1.

FIG. 11A shows a state in which, by supplying data signal 100 and a dock signal as shown in FIG. 11B from the control signal input terminal 60 to the control circuit 7, a burn-in data from the first input terminal 31 is supplied to the first and third scan chains.

This embodiment achieves an advantage that circuit design is made simple, since flip-flops are employed for the control circuit.

Although flip-flops are described in this embodiment, other elements capable of storing a state such as latches, RAMs, ROMs, and the like may be employed to achieve the same advantageous effects.

EMBODIMENT 11

Figure 12:
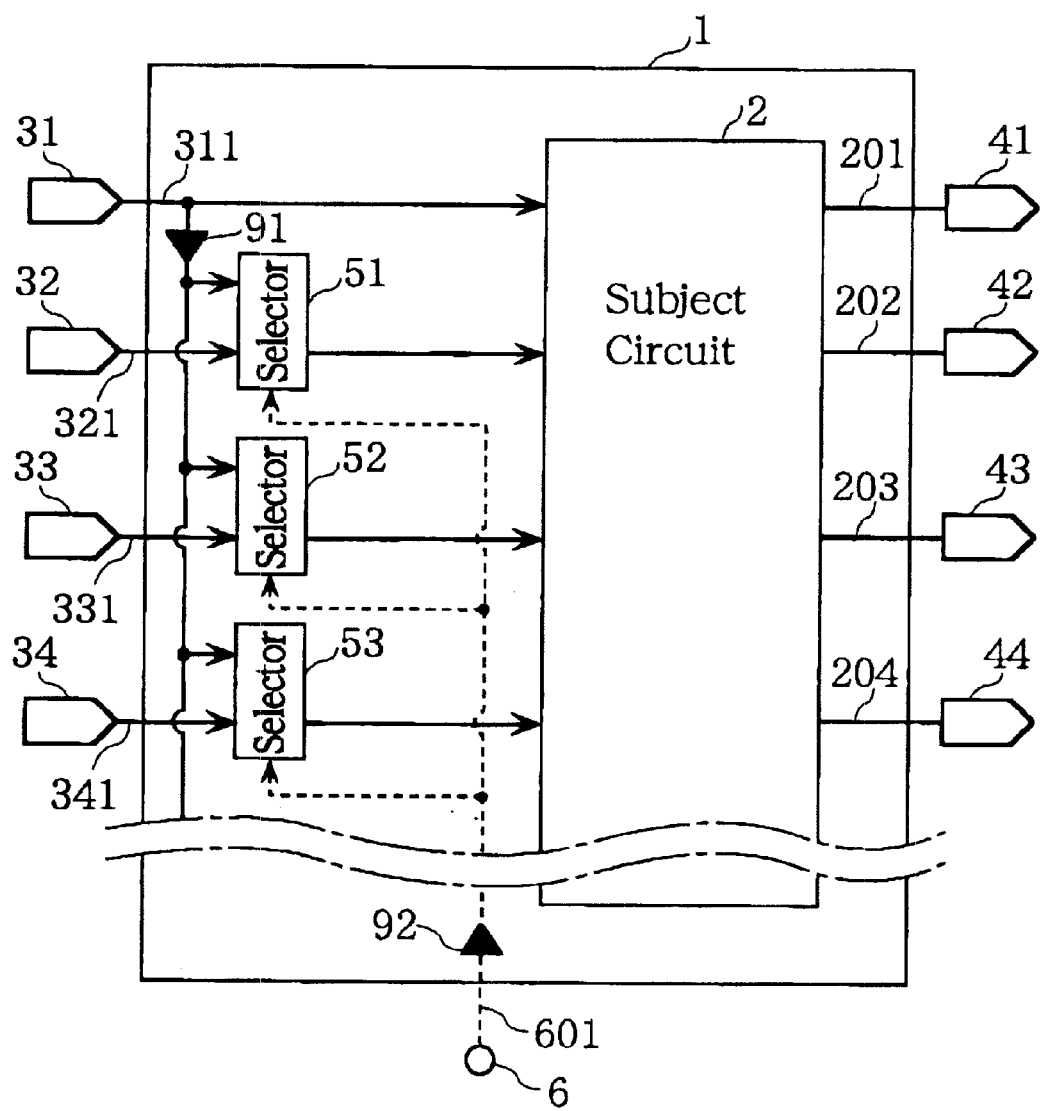
FIG. 12 is a diagram showing a semiconductor device according to Embodiment 11 of the present invention.

As shown in FIG. 12, this embodiment is a variation of the foregoing Embodiment 2 shown in FIG. 3A, in which data for burn-in testing are simultaneously supplied to a multiplicity of scan chains by a multiplicity of selectors 51, 52, 53 . . . In addition, the selecting signal 601 from the selecting signal input terminal 6 is amplified by an amplifier 92.

EMBODIMENT 12

Figure 13:
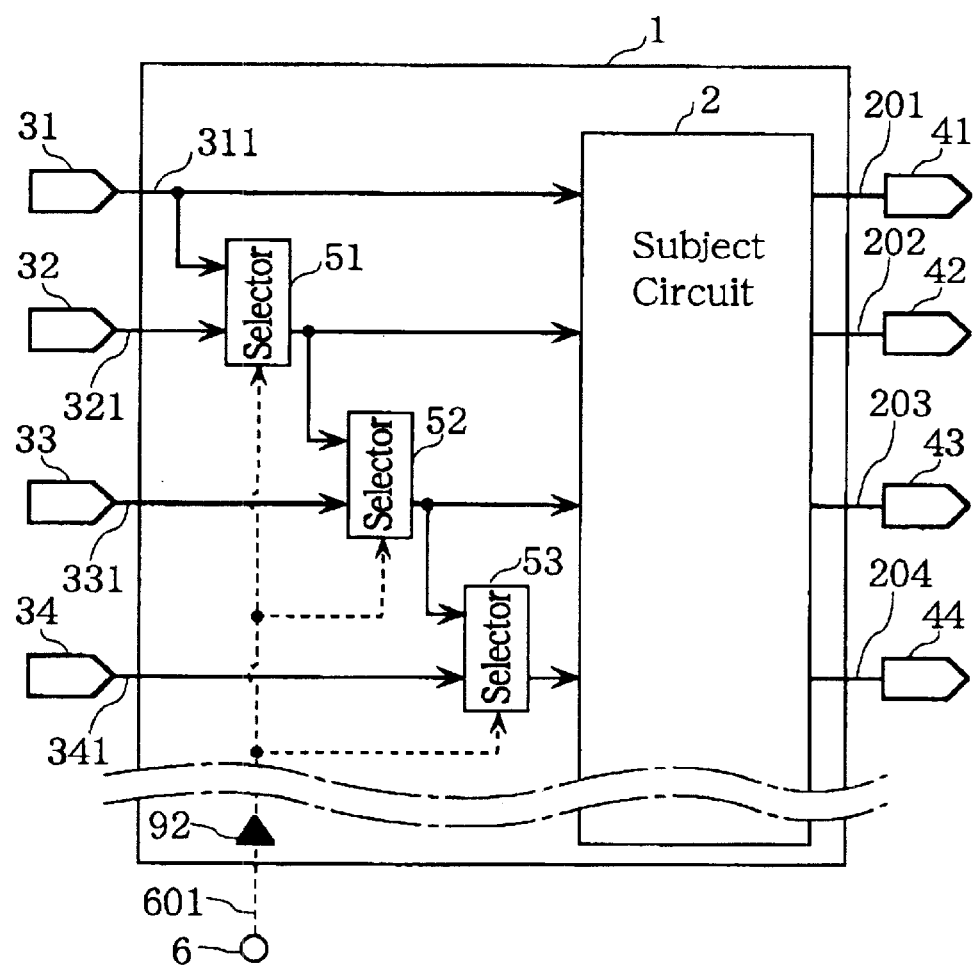
FIG. 13 is a diagram showing a semiconductor device according to Embodiment 12 of the present invention.

As shown in FIG. 13, this embodiment is a variation of the foregoing Embodiment 3 shown in FIG. 4A, in which a data for burn-in testing supplied from the first input terminal 31 is simultaneously supplied to a multiplicity of scan chains by a multiplicity of selectors 51, 52, 53 . . . connected in cascade.

EMBODIMENT 13

Figure 14:
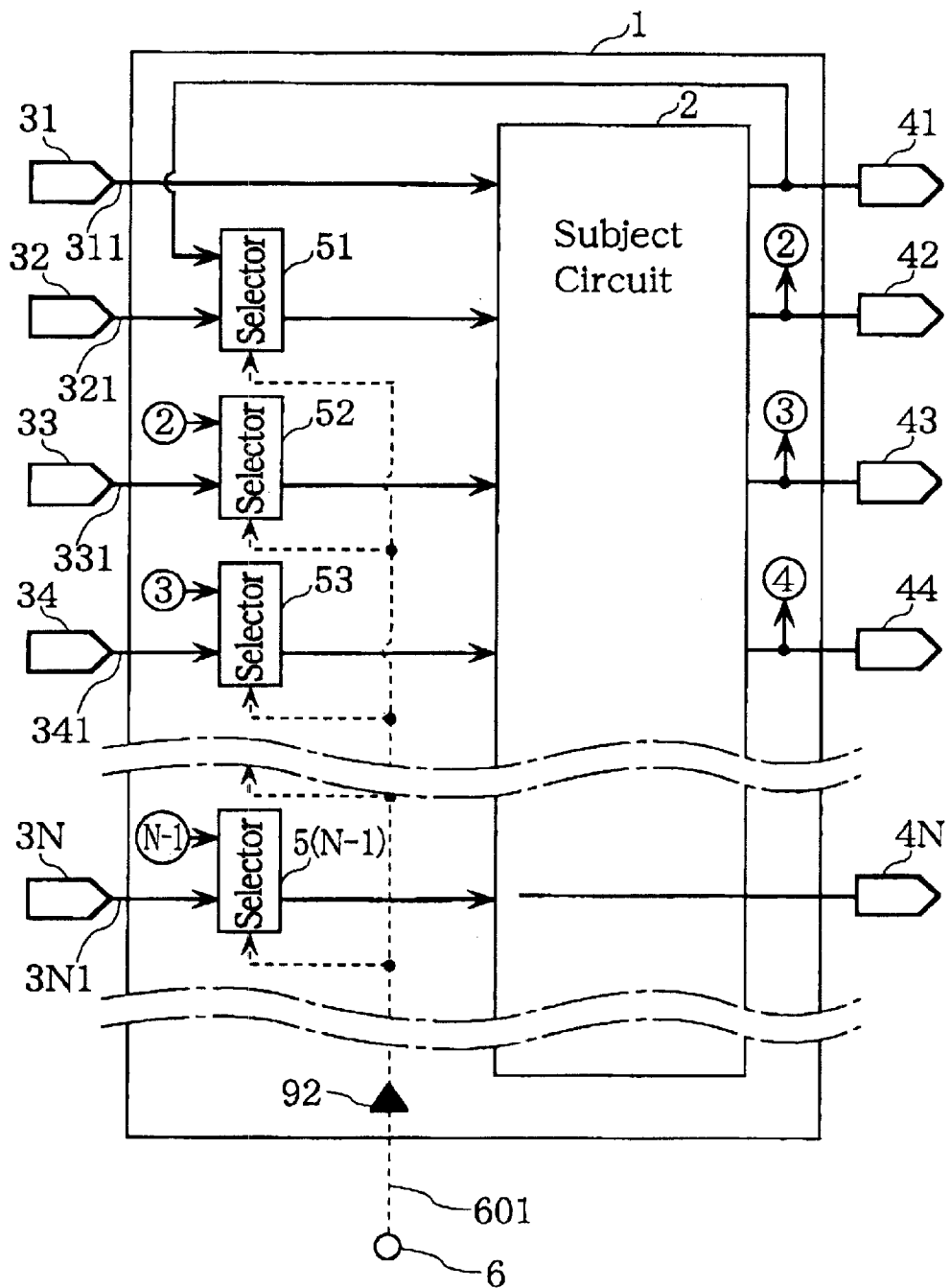
FIG. 14 is a diagram showing a semiconductor device according to Embodiment 13 of the present invention.

As shown in FIG. 14, this embodiment is a variation of the foregoing Embodiments 4 to 8 as shown in FIGS. 5 to 8B. In a semiconductor device according to this embodiment, a data for burn-in testing being output from a first scan chain and an input signal 321 from an input terminal 32 are selectively supplied via a selector 51 to a second scan chain. Likewise, a data for burn-in testing being output from the second chain and an input signal 331 from an input terminal 33 are selectively supplied via a selector 52 to a third scan chain. Likewise, a data for burn-in testing being output from an (n−1)th scan chain and an input signal from an n th input terminal are selectively supplied via a selector to an n th scan chain.

According to such a configuration, further complicated testing can be implemented. In this embodiment as well, such elements as an amplifying circuit, various buffers with various delay time, corresponding selectors therefor, and the like may be provided in the device depending on needs. In addition, the connection of the selectors may be such as, for example, shown in FIG. 4A.

Although the present invention and its advantages have been described in detail with respect to preferred embodiments thereof, various changes, modifications, and alterations will be apparent to those skilled in the art without departing from the spirit and scope of the invention as defined by the appended claims. In particular, the following are possible.

(1) The number of scan chains may be more than that described in each embodiment.

(2) An input from an input terminals for a scan chain and an output from the scan chain may be supplied to another scan chain. For example, a device shown in FIG. 2 or 3 is combined with a device shown in FIG. 5 or 6.

(3) Embodiments described above are combined in various ways.

(4) In Embodiment 10, although the selector selecting one of three inputs is controlled by two flip-flops, such a configuration as shown in FIGS. 3B and 6B that three selectors connected in parallel are controlled by flip-flops each provided for each of the selectors may be employed.

(5) A plurality of input terminals and/or a plurality of output terminals may be connected to a single scan chain, or such scan chain may be provided among others.

What is claimed is:

1. A semiconductor device comprising:
   a first scan chain having a first input terminal;
   a second scan chain having a second input terminal; and
   a selecting means for selecting one of first data from said first input terminal and second data from said second input terminal and supplying the selected first and second data to the second scan chain.

2. A semiconductor device according to claim 1, wherein, when burn-in testing is performed, the selecting means selects the data from the first input terminal so that the data received from the first input terminal is supplied to the second scan chain.

3. A semiconductor device comprising:
   a plurality of scan chains each having an exclusive input terminal for receiving data for scan testing; and
   a connection-controlling means for controlling the connection of at least one of the plurality of scan chains such that, when burn-in testing is performed, the at least one of the plurality of scan chains receives the data from the input terminal of another one of the plurality of scan chains.

4. A semiconductor device comprising:
   a first scan chain;
   a second scan chain having an input terminal which receives data independently of the first scan chain; and
   a selecting means for selecting one of the data supplied from the first scan chain and the data received from the input terminal and supplying the selected data to the second scan chain.

5. A semiconductor device according to claim 4, wherein, when burn-in testing is performed, the selecting means selects the test data supplied from the first scan chain and supplies the selected data to the second scan chain.

6. A semiconductor device comprising a plurality of scan chains each having an exclusive external input terminal for receiving data for scan testing and an output part for outputting the data, wherein:
   when burn-in testing is performed, at least one of the plurality of scan chains receives the test data supplied from the output part of another one of the plurality of scan chains.

* * * * *